United States Patent
Hong

[19]

[11] Patent Number: 6,124,760

[45] Date of Patent: Sep. 26, 2000

[54] TRANSCONDUCTANCE CONTROL CIRCUIT FOR RAIL-TO-RAIL (RTR) DIFFERENTIAL INPUT TERMINAL

[75] Inventor: Kuk-Tae Hong, Sungnam, Rep. of Korea

[73] Assignee: LG Semicon Co., Ltd., Chungcheongbuk-Do, Rep. of Korea

[21] Appl. No.: 09/291,980

[22] Filed: Apr. 15, 1999

[30] Foreign Application Priority Data

Feb. 12, 1999 [KR]  Rep. of Korea ........................ 99-5029

[51] Int. Cl.[7] ...................................................... H03F 3/45
[52] U.S. Cl. .......................................... 330/253; 330/261
[58] Field of Search ..................................... 330/253, 261

[56] References Cited

U.S. PATENT DOCUMENTS

| | | | |
|---|---|---|---|
| 4,797,631 | 1/1989 | Hsu et al. ................................ | 330/253 |
| 4,887,048 | 12/1989 | Krenik et al. ............................ | 330/258 |
| 5,371,474 | 12/1994 | Wassenaar et al. ...................... | 330/253 |
| 5,384,548 | 1/1995 | Sakurai et al. ........................... | 330/253 |
| 5,631,607 | 5/1997 | Huijsing et al. ......................... | 330/253 |

*Primary Examiner*—Robert Pascal
*Assistant Examiner*—Henry Choe
*Attorney, Agent, or Firm*—Morgan, Lewis & Bockius LLP

[57] ABSTRACT

A transconductance control circuit includes a differential input terminal wherein first and second differential MOS transistor pairs are parallel connected, a first current source connected between a supply voltage terminal and respective sources of the first differential MOS transistor pair and for providing a first bias current, and a second current source connected between a source of the second differential MOS transistor pair and ground, and for providing a second bias current. The circuit further includes a current detector for detecting respective bias currents of the first and second current sources and the current detector includes one DC path which leads from Vdd to Vss. The circuit decreases a transconductance variation by varying an operational voltage of a differential MOS transistor pair at an RTR differential input terminal and decreases power consumption while decreasing chip size.

9 Claims, 5 Drawing Sheets

6,124,760

1

TRANSCONDUCTANCE CONTROL CIRCUIT FOR RAIL-TO-RAIL (RTR) DIFFERENTIAL INPUT TERMINAL

BACKGROUND OF THE INVENTION

1. Field of the Invention

The present invention relates to a rail-to-rail differential input terminal for an operational amplifier, and more particularly, to an improved transconductance control circuit for a rail-to-rail differential input terminal.

2. Description of the Background Art

As a VLSI (very large scaled integrated) circuit prefers a low supply voltage (less than 3.3V), a complementary CMOS circuit has significantly decreased its operational range. One of the analog circuits most effected by the decreased supply voltage is an input terminal 10 connected to an operational amplifier 20 as shown in FIG. 1. The input terminal 10 generally includes a single differential input pair having a common mode input range which is half the entire supply voltage range.

Such a single differential input pair are confined to either side of the supply rail and accordingly are inappropriate to a low voltage (3.3V) application. In application fields of low voltages (less than 3.3V), the input terminal 10 is implemented as an inter-complementary differential input pair so as to extend a common mode input range to an entire RTR.

FIG. 2 shows a schematic construction of a conventional CMOS RTR differential input terminal 100 including an inter-complementary differential input pair, wherein NMOS transistor pair NM1, NM2 and PMOS transistor pair PM1, PM2 are parallel connected.

A first differential input Vin1 is applied to respective gates of the PMOS transistor PM1 and the NMOS transistor NM1. A second differential input VIN2 is applied to respective gates of the PMOS transistor PM2 and the NMOS transistor NM2. At this time, the first and second differential inputs Vin1, Vin2 form a common mode. Also, bias current Ip is induced from supply voltage VDD terminal to the PMOS transistor pair PM1, PM2, and a bias current In is induced from respective sources of the NMOS transistor pair NM1, NM2 to ground.

The operation of the thusly constituted conventional differential input terminal 100 will now be described.

Depending upon a common mode voltage $V_{CM}$ of the first and second differential inputs Vin1, Vin2, the RTR differential input terminal 100 is provided with three operational types.

That is, when the common mode voltage $V_{CM}$ is close to Vss, only the PMOS transistors PM1, PM2 are driven, when the common mode voltage $V_{CM}$ exists between Vdd and Vss the PMOS transistors PM1, PM2 and NMOS transistors NM1, NM2 are all operated, and when the common mode voltage $V_{CM}$ is close to Vdd also the NMOS transistors NM1, NM2 are operated. Here, the NMOS transistor pair and the NMOS transistor pair are matching with each other.

At this time, an important parameter in the above operation is a transconductance gm, since a unity gain frequency of the operational amplifier 20 is proportional to the transconductance of the input terminal 10. Namely, a constant transconductance secures the unity gain frequency of the operational amplifier 20 within the entire common mode input range.

In FIG. 2, a transconductance gmp of the PMOS transistors and a transconductance gmn of the NMOS transistors have characteristics as shown in FIG. 4, in accordance with voltage drop of gate-supply voltages Vgs of a PMOS transistor PM3 and an NMOS transistor NM3. Also, the total transconductance gmt is implemented by adding gmp and gmn.

2

As shown in FIG. 4, the total transconductance gmt is highly variable in the common mode input range $V_{CM}$. Therefore, the conventional RTR differential input terminal 100 enables the common mode input range to extend to the entire supply rail but the size and variation of the total transconductance gmt is disadvantageously large, thereby deteriorating frequency characteristics of the operational amplifier 20.

Specifically, as shown in FIG. 4, the total transconductance gmt in the common mode input range shows about 100% in variation, that is, from minimal 8 to maximal. As a result, in accordance with the large variation of the transconductance gmt, the operational amplifier 20 does not obtain a single gain frequency, whereby the frequency compensation of the operational amplifier 20 becomes difficult.

So, a transconductance control circuit is employed at the RTR input terminal so as to decrease variation of the total transconductance gmt.

FIG. 3 shows a current detection circuit 102 as a portion of a transconductance control circuit.

As shown therein, PMOS transistors PM4~PM7 are large size transistors (W=2μm, L=500μm) identical to the NMOS transistors NM1, NM2 provided in the RTR differential input terminal 100, wherein PMOS transistors PM6, PM7 form current mirror.

As the input voltage Vin increases, the bias current Ip induced to the PMOS transistor PM3 becomes equal to the current at the PMOS transistor PM6. current at the PMOS transistor PM6 is copied into the PMOS transistor PM7 in accordance with the current mirror operation of the PMOS transistors PM6, PM7, thereby detecting the bias current Ip.

The detected bias current is applied to a bias circuit (not shown) so that the current In which flows through an n-type MOS transistor pair NM1, NM2 as shown in FIG. 2 is controlled.

However, the conventional current detection circuit should provide large size PMOS transistors PM6, PM7 identical to the NMOS transistor pair PM1, PM2 so as to detect the bias current Ip which flows through the PMOS transistor pair PM1, PM2, thereby disadvantageously increasing chip size in implementation of the current detection circuit.

Further, the conventional current detection circuit has two DC paths which lead from Vdd to Vss, thereby increasing power consumption.

SUMMARY OF THE INVENTION

Therefore, it is an object of the present invention to provide a transconductance control circuit capable of decreasing a transconductance variation by varying an operational voltage of a differential MOS transistor pair at an RTR differential input terminal.

It is another object of the present invention to provide a transconductance control circuit capable of decreasing power consumption while decreasing chip size.

To achieve the above-described objects, there is provided a transconductance control circuit according to the present invention which includes a differential input terminal wherein first and second differential MOS transistor pairs are parallel connected, a first current source connected between a supply voltage terminal and respective sources of the first differential MOS transistor pair and for providing a first bias current, and a second current source connected between a source of the second differential MOS transistor pair and ground, and for providing a second bias current. The circuit further includes a current detector for detecting respective bias currents of the first and second current sources and the current detector includes one DC path which leads from Vdd to Vss.

Further, to achieve the above-described objects, there is provided a transconductance control circuit according to the present invention which includes a differential input terminal including a first MOS transistor pair and a second MOS transistor pair connected parallel to the first MOS transistor pair, a first current source connected to a supply voltage terminal and respective sources of the first MOS transistor pair and for providing a first bias current, a second current source connected between sources of the second MOS transistor pair and ground, and for providing a second bias current, and a current monitoring unit connected to the first and second current sources of the differential input terminal and for controlling either bias current of the first and second current sources in accordance with the other bias current of the first and second current sources.

The features and advantages of the present invention will become more readily apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 5:
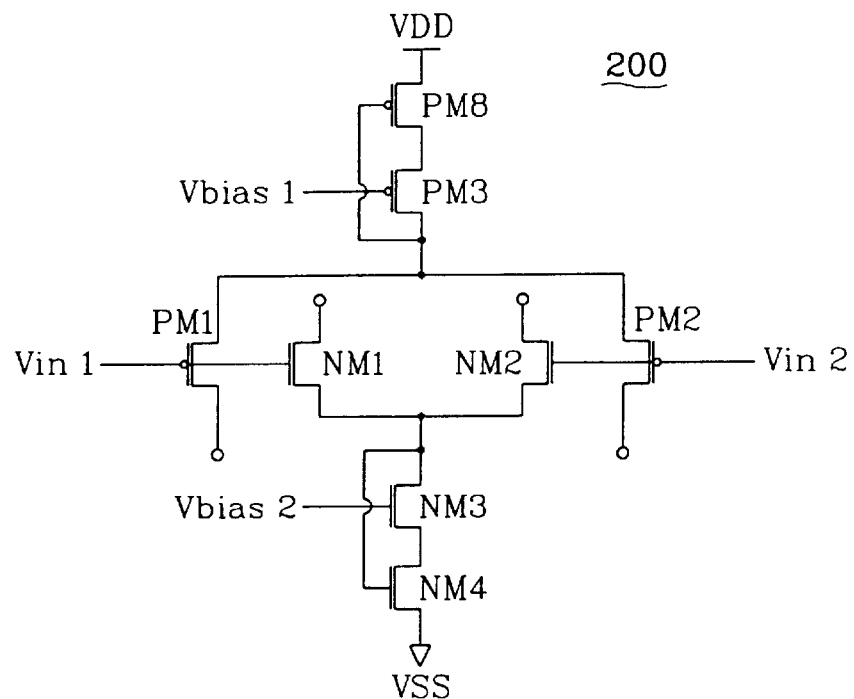
FIG. 5 is a circuit view illustrating a CMOS RTR differential input terminal according to the present invention.

FIG. 5 is a circuit view illustrating an RTR differential input terminal 200 according to the present invention. As shown therein, the RTR differential input terminal 200 further includes a PMOS transistor PM8 and an NMOS transistor NM4 in addition to the conventional RTR differential input terminal 100. At this time, a P-channel includes PMOS transistors PM8, PM3, PM1 or PM2, and an N-channel includes NMOS transistors NM1 or NM2, NM3 and NM4. The PMOS transistors PM8, PM3 form a first current source, and NMOS transistors NM3, NM4 form a second current source.

In the above construction, an operation voltage Vp of the P-channel and an operation voltage Vn of N-channel are respectively implemented as follows.

$$VP = V_{DS(PM3)} + V_{GS(PM1\ or\ PM2)} + V_{DS(PM8)}$$

$$Vn = V_{DS(NM3)} + V_{GS(NM1\ or\ NM2)} + V_{DS(NM4)}$$

Therefore, the operational voltages of the P-channel and N-channel become dropped by drain-supply voltage $V_{DS}$ (about 0.5V) of the PMOS transistor PM8 and NMOS transistor NM4, and the operation voltage drop of the respective channels decreases the variation of the total transconductance gmt within the common mode input range.

Figure 9:
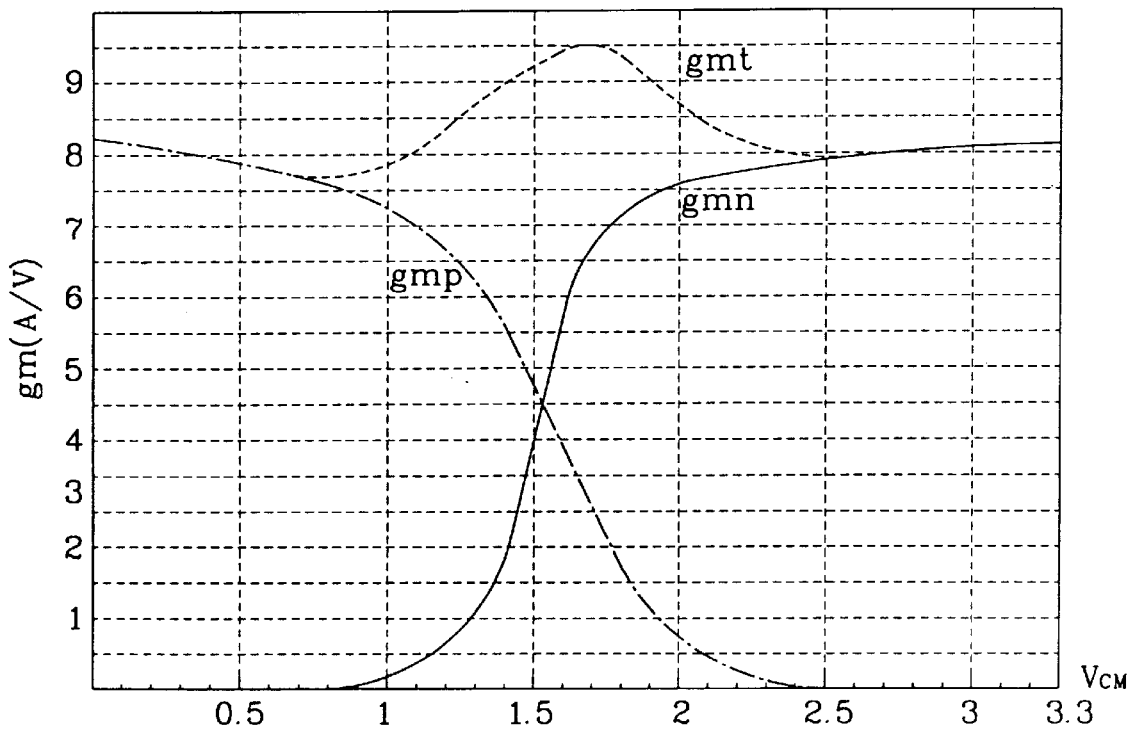
FIG. 9 is a graph illustrating transconductance variation with regard to the common mode voltage in FIG. 5.
Figure 10:
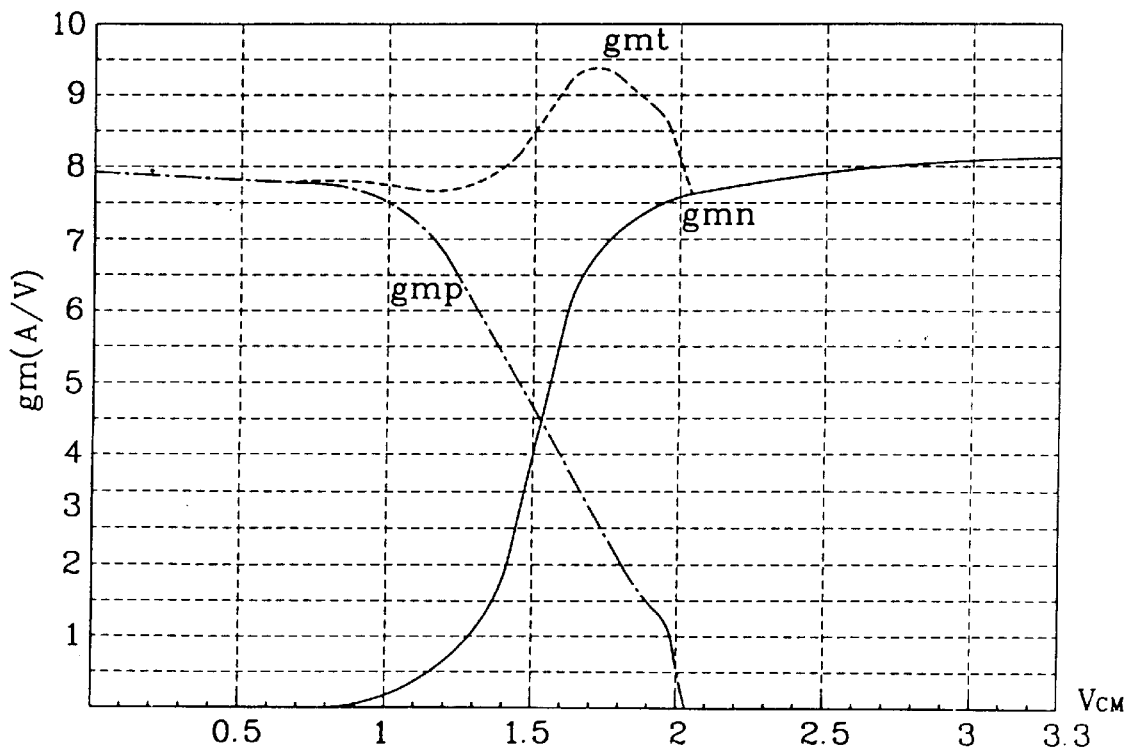
FIG. 10 is a graph illustrating transconductance variation with regard to the common mode voltage in FIG. 8.

FIG. 9 is a graph illustrating the transconductance variation with regard to the common mode voltage $V_{CM}$ in the RTR differential input terminal 200.

Figure 1:
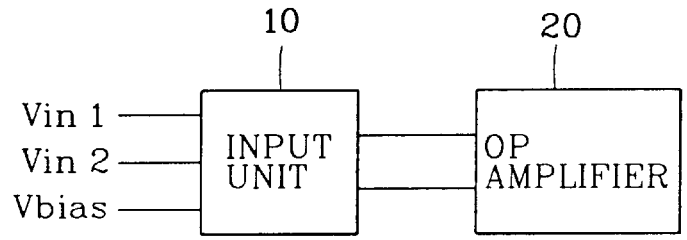
FIG. 1 is a block diagram illustrating an input terminal connected to an operational amplifier.
Figure 2:
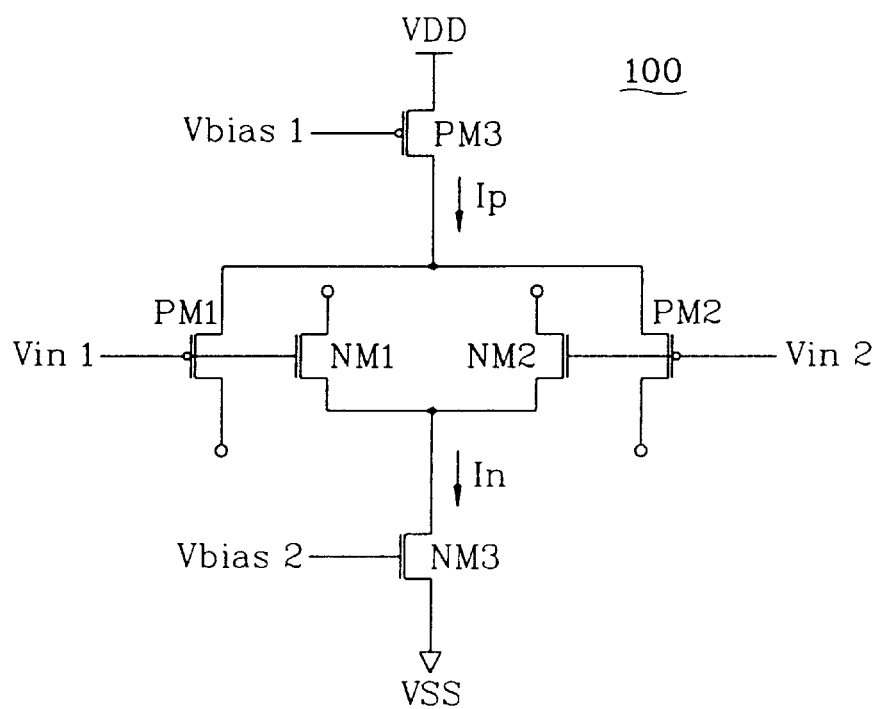
FIG. 2 is a circuit view illustrating a conventional CMOS RTR differential input terminal.
Figure 3:
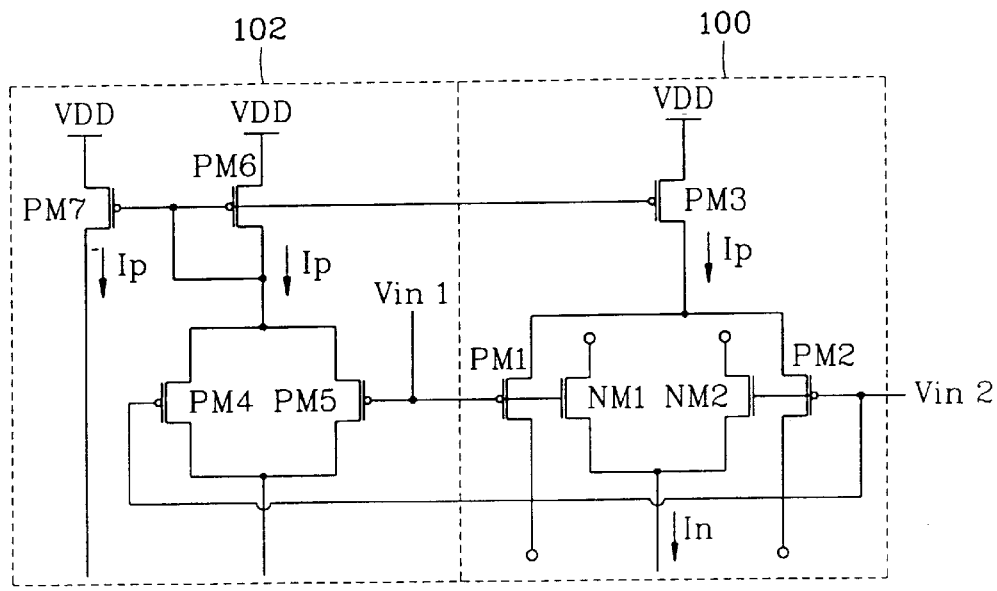
FIG. 3 is a circuit view illustrating a current detector connected to the differential input terminal in FIG. 2.
Figure 4:
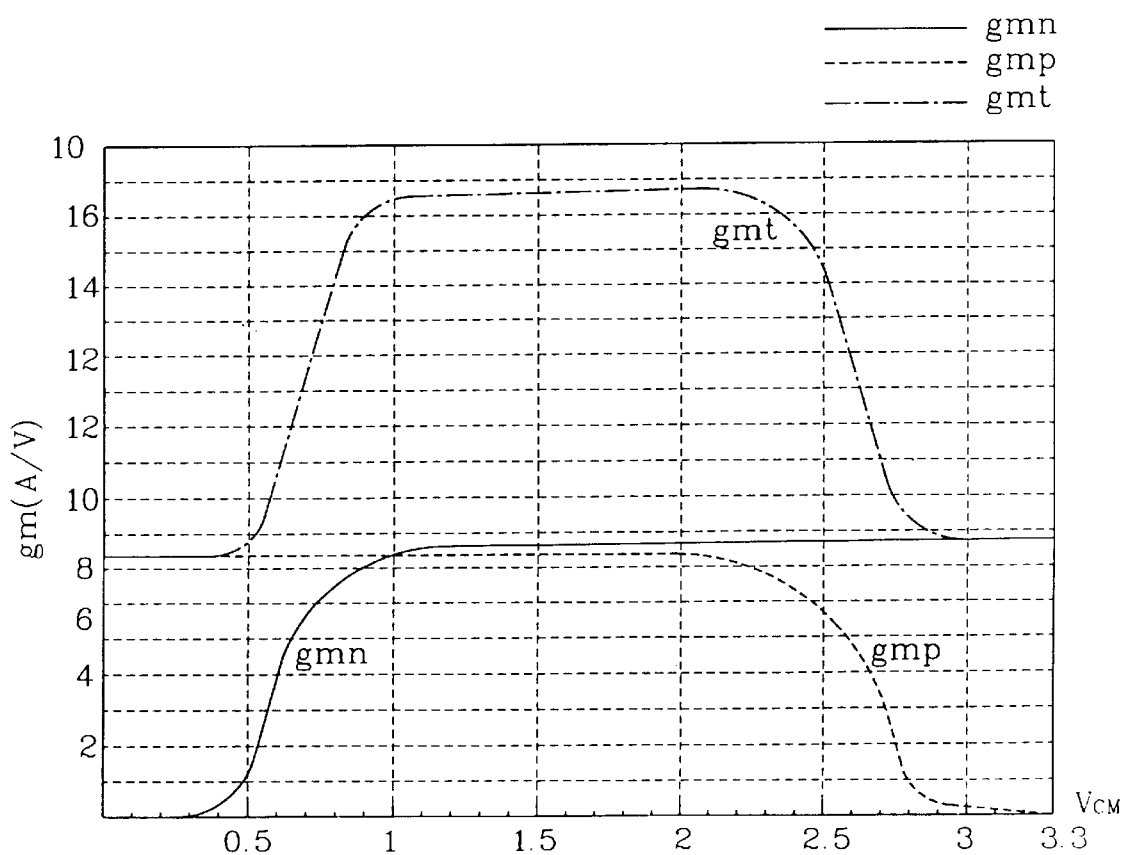
FIG. 4 is a graph illustrating a transconductance variation with regard to a common mode voltage $V_{CM}$.

Comparing respective transconductance variations in FIGS. 4 and 9, it is understood that the transconductances gmp, gmn of the PMOS transistor and NMOS transistor in FIG. 9 is narrowed by 0.5V with reference to the common mode voltage $1.5V_{CM}$. At this time, assuming that the variation (minimal 8 to maximal 16) of the total transconductance gmt of the conventional RTR input terminal 100 as shown in FIG. 4 were 100%, the total transconductance gmt of the RTR input terminal according to the present invention is decreased by about 25%, that is, from minimal 7.5 to maximal 9.5.

Figure 6:
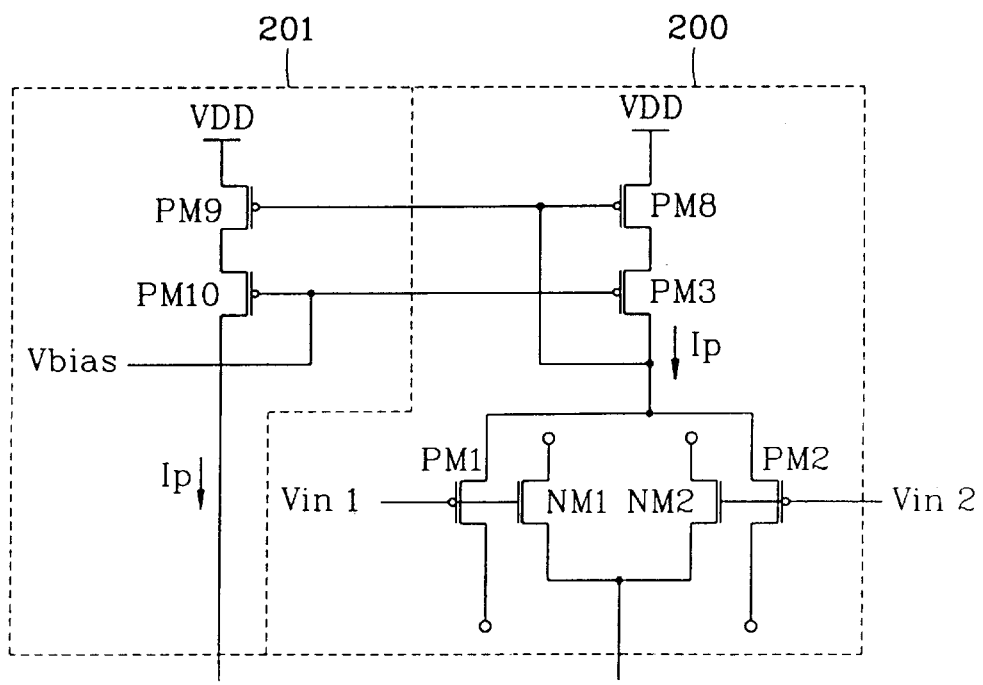
FIG. 6 is a circuit view illustrating a first embodiment of the current detector connected to the differential input terminal in FIG. 5.
Figure 7:
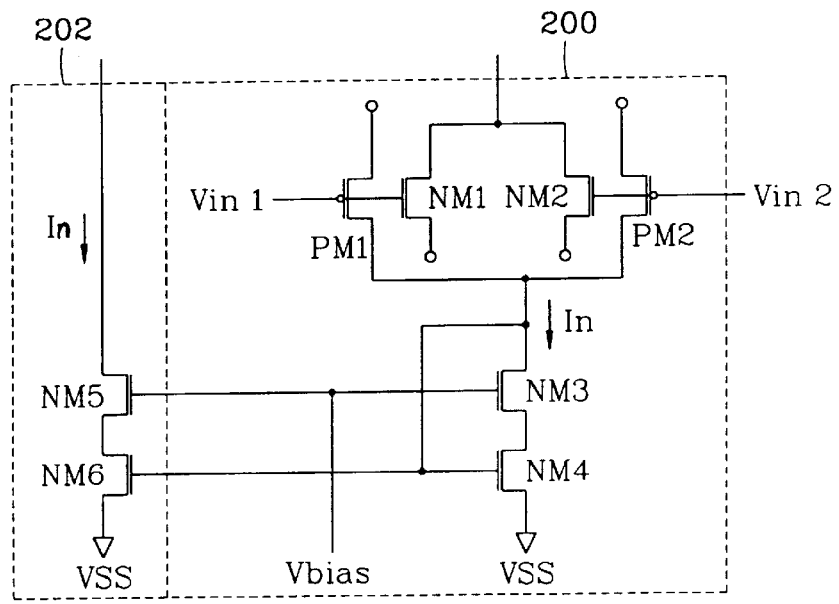
FIG. 7 is a circuit view illustrating a second embodiment of the current detector connected to the differential input terminal in FIG. 5.

FIGS. 6 and 7 show the embodiments of the current detection circuits 201, 202 electrically connected to the RTR differential input terminal 200.

The current detection circuit 201 includes one DC path as shown in FIG. 6 and PMOS transistors PM9, PM10 serially connected in correspondence to the PMOS transistors PM8, PM3 of the RTR input terminal 200 instead of to the conventional large size transistors. As shown in FIG. 7, the current detection circuit 202 includes NMOS transistor NM9, NM10 serially connected in correspondence to one DC path and the NMOS transistors NM3, NM4 of the RTR input terminal 200.

Therefore, the bias current Ip of the first current sources PM8, PM3 is copied into the PMOS transistor PM9 and detected accordingly, and the bias current In of the second current source NM3, NM4 is copied into the NMOS transistor NM6 and detected accordingly.

Figure 8:
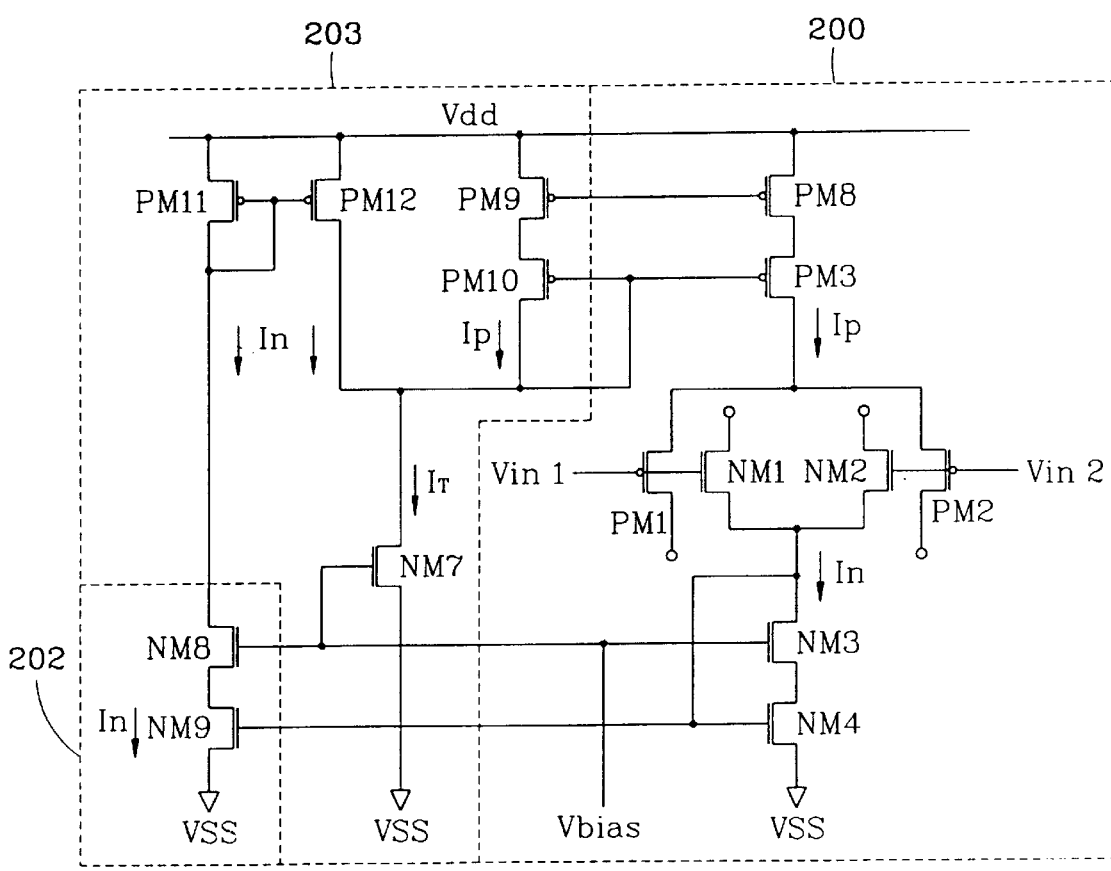
FIG. 8 is a circuit view illustrating a transconductance control circuit of an RTR input terminal according to the present invention.

FIG. 8 is a view illustrating a transconductance control circuit including the current detector 202 and the bias circuit 203 according to the present invention.

The bias circuit 203 receives the bias current In detected from the current detector 202 and controls the bias current Ip of the first current source PM8, PM3. In addition to the current detector 202 detecting the bias current Ip of the first current sources PM8, PM3, there may be further provided a bias circuit which receive the bias current Ip detected from the current detector 201 and controls the bias current In of the second current sources NM3, NM4.

Also, a current monitoring unit having a current detector and a bias unit is electrically connected to the RTR differential input terminal 200, whereby the bias current of either of the first and second current sources is detected, thereby controlling the bias current of the other thereof. That is, the current monitoring unit controls the bias current by detecting the bias current of the first current source or controls the first current source by detecting the second current source.

Among the above methods, an exemplary method with regard to the present invention will now be described, wherein the bias current In is detected from the current detector 202 and accordingly the bias current Ip which flows through the P-channels PM8, PM3, PM1 or PM2 is controlled.

When the bias current Vbias is received, the bias current In flowing through the NMOS transistor NM3 is copied into the NMOS transistor NM9 of the current detector 202 and the copied bias current In identically flows through the PMOS transistor PM11 of the bias unit 203. As a result, the bias current In also flows through the PMOS transistor PM12 in accordance with the current mirror operation of the PMOS transistors PM11, PM12.

At this time, assuming that the current which flows through the PMOS transistor PM10 is Ip and the current which flows through the NMOS transistor NM15 is $I_T/a$, the following equation is satisfied. Here, a denotes a size ration (W/L) of the NMOS transistor NM15.

$$I_T/a = In + Ip \qquad (1)$$

Accordingly, through an appropriate control of a, the bias current Ip with regard to the bias current In is generated at a point where the transconductance variation is least. The generated bias current Ip is copied into the PMOS transistor PM8 and flows through the P-channels PM8, PM3, PM1 or PM2, whereby the bias current Ip is controlled. Consequently, since the size of the NMOS transistor NM7 is appropriate, the bias current Ip which flows through the P-channels PM8, PM3, PM1 or PM2 is controlled.

At this time, in order to obtain the variation rate of the total transconductance gmt, the total transconductance gmt of the transconductance control circuit as shown in FIG. 7 is as follows:

$$gmt = \sqrt{2Kp \cdot a \cdot Ip} + \sqrt{2Kn \cdot In} \qquad (2)$$

where, $$K = \frac{\mu C_{OX}}{2L} \mathsf{W},$$

Kn denotes a device transconductance parameter of N-channels, and Kp denotes a device transconductance parameter of P-channels. Here, assuming that the NMOS transistor and PMOS transistor is matched with each other (Kn=Kp), equation 2 may be simplified as equation 3.

$$gmt = \sqrt{2K}(\sqrt{a \cdot Ip} + \sqrt{In}) \qquad (3)$$

And, equation 1 is substituted for equation 3 to obtain equation 4.

$$gmt = \sqrt{2K}(\sqrt{I_{T-a \cdot In}} + \sqrt{In}) \qquad (4)$$

Therefore, the variation rate of the total transconductance gmt in accordance with a-value variation in equation 4 is as table 1.

TABLE 1

| a | gmt variation |
|---|---|
| 1.5 | 16% |
| 1.6 | 15% |
| 1.7 | 14% |
| 1.8 | 18% |

According to table 1, a value having a least gmt variation is 1.7 and at this time the gmt variation rate is 14%.

As described above, the present invention varies the operation voltage of the RTR differential input terminal and decreases the transconductance variation.

Also, a large size transistor is not required in the present invention and a current detection circuit having one DC path is realized, thereby decreasing chip size and power consumption.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A transconductance control circuit, comprising:
   a differential input terminal wherein first and second differential MOS transistor pairs are parallel connected;
   a first current source for providing a first bias current, the first current source including
     a first PMOS transistor having a source thereof connected to a supply voltage terminal, and
     a second PMOS transistor having a source thereof connected to a drain of the first PMOS transistor, a first bias voltage applied through a gate thereof, and a drain thereof connected in common to a gate of the first PMOS transistor and respective sources of the first differential MOS transistor pair; and
   a second current source for providing a second bias current, the second current source including
     a first NMOS transistor having a drain thereof connected to respective sources of the second differential MOS transistor pair, and a second bias voltage applied to a gate thereof, and
     a second NMOS transistor having a drain thereof connected to a source of the first NMOS transistor, a gate thereof connected to a drain of the first NMOS transistor, and a source thereof connected to ground.

2. The circuit of claim 1, wherein the first differential MOS transistors are p-type and the second differential MOS transistors are n-type.

3. The circuit of claim 1, wherein the first differential MOS transistors are p-type.

4. The circuit of claim 1, wherein the second differential MOS transistor pair are n-type.

5. The circuit of claim 1, wherein a voltage drop in accordance with the first PMOS transistor is about 0.5V.

6. The circuit of claim 1, wherein a voltage drop in accordance with the second NMOS transistor is about 0.5V.

7. A transconductance control circuit, comprising:
   a differential input terminal including a first MOS transistor pair and a second MOS transistor pair connected parallel to the first MOS transistor pair;
   a first current source connected to a supply voltage terminal and respective sources of the first MOS transistor pair and for providing a first bias current, the first current source including first and second PMOS transistors;
   a second current source connected between sources of the second MOS transistor pair and ground and for providing a second bias current, the second current source including first and second NMOS transistors; and
   a current monitoring unit for controlling the first bias current in accordance with the second bias current, wherein the current monitoring unit comprises
     a current detector connected to the second current source and detecting the second bias current, the current detector including third and fourth NMOS transistors connected in series between the supply voltage terminal and ground, respective gates thereof connected to gates of the first and second NMOS transistor, and a bias unit connected to the first current source for controlling the first bias current in accordance with an output of the current detector, the bias unit comprising third and fourth PMOS transistors for performing a current mirror operation with regard to the bias current detected from the second current source, fifth and sixth PMOS transistors connected parallel with the fourth PMOS transistor, respective gates thereof connected to the first current source, and a fifth NMOS transistor having a drain thereof connected to respective drains of the fourth and sixth PMOS transistors and the first current source, a gate thereof receiving a bias voltage, and a source thereof connected to ground.

8. The circuit of claim 1, wherein the first current source comprises:

a first PMOS transistor having a source thereof connected to the supply voltage terminal;

a second PMOS transistor having a source thereof connected to a drain of the first PMOS transistor, a first bias voltage applied through a gate thereof, and a drain thereof connected to a gate of the first PMOS transistor and respective sources of the first differential MOS transistor pair; and wherein the second current source comprises:

a first NMOS transistor having a drain thereof connected to a source of the second differential MOS transistor pair and a gate thereof receiving the second bias voltage; and a second NMOS transistor having a drain thereof connected to a source of the first NMOS transistor, a gate thereof connected to a drain of the first NMOS transistor, and a source thereof connected to ground.

9. The circuit of claim 7, wherein the current which flows through the fifth NMOS transistor is a sum current of respective currents which flow through the fourth and sixth PMOS transistors, and the current flowing through the sixth PMOS transistor is controlled by the size of the fifth NMOS transistor.

* * * * *